United States Patent
Lee et al.

(10) Patent No.: US 9,904,994 B2
(45) Date of Patent: Feb. 27, 2018

(54) METHOD AND APPARATUS FOR ANALYZING SHAPE OF WAFER

(71) Applicant: LG SILTRON INCORPORATED, Gumi-si (KR)

(72) Inventors: Jae Hyeong Lee, Gumi-si (KR); Ja Young Kim, Gumi-si (KR)

(73) Assignee: LG SILTRON INCORPORATED, Seoul (KR)

( * ) Notice: Subject to any disclaimer, the term of this patent is extended or adjusted under 35 U.S.C. 154(b) by 0 days.

(21) Appl. No.: 15/105,240

(22) PCT Filed: Jun. 25, 2014

(86) PCT No.: PCT/KR2014/005620
§ 371 (c)(1),
(2) Date: Jun. 16, 2016

(87) PCT Pub. No.: WO2015/099251
PCT Pub. Date: Jul. 2, 2015

(65) Prior Publication Data
US 2016/0314577 A1    Oct. 27, 2016

(30) Foreign Application Priority Data
Dec. 24, 2013 (KR) .......................... 10-2013-0162085

(51) Int. Cl.
*G06K 9/00* (2006.01)
*G06T 7/00* (2017.01)
(Continued)

(52) U.S. Cl.
CPC .............. *G06T 7/0006* (2013.01); *G06T 7/60* (2013.01); *H01L 22/12* (2013.01); *G06T 2207/10061* (2013.01); *G06T 2207/30148* (2013.01)

(58) Field of Classification Search
CPC ......... H01L 22/12; G06T 7/0006; G06T 7/60; G06T 2207/10061; G06T 2207/30148
See application file for complete search history.

(56) References Cited

U.S. PATENT DOCUMENTS 6,768,964 B2 * 7/2004 Souda ............... H01L 21/67282
257/E23.179
6,916,726 B2 * 7/2005 Ohno .................. H01L 21/3043
257/E21.238
(Continued)

FOREIGN PATENT DOCUMENTS

JP        09-091441       4/1997
JP       2001-281158     10/2001
(Continued)

OTHER PUBLICATIONS

Hiroaki Okamoto et al: "Method for wafer edge profile extraction using optical images obtained in edge defect inspection process", SPIE—International Society for Optical Engineering. Proceedings, vol. 7638, Mar. 11, 2010 (Mar. 11, 2010), p. 763826, XP055369534, US.
(Continued)

*Primary Examiner* — Gregory M Desire
(74) *Attorney, Agent, or Firm* — Ked & Associates, LLP

(57) ABSTRACT

A method for analyzing the shape of a wafer according to an embodiment comprises the steps of: acquiring a sectional image showing a wafer to be analyzed; finding a coordinate row of the surface contour of the wafer in the sectional image; and obtaining shape analysis data, including information about the shape of the wafer, using the coordinate row.

18 Claims, 14 Drawing Sheets

(51) Int. Cl.
*H01L 21/66* (2006.01)
*G06T 7/60* (2017.01)

(56) References Cited

U.S. PATENT DOCUMENTS

| | | | | |
|---|---|---|---|---|
| 8,972,911 | B2* | 3/2015 | Matsuoka | G01B 15/04 |
| | | | | 716/55 |
| 2005/0045821 | A1* | 3/2005 | Noji | G01N 23/225 |
| | | | | 250/311 |
| 2006/0169208 | A1* | 8/2006 | Shinozaki | G03F 7/7075 |
| | | | | 118/715 |
| 2008/0013089 | A1* | 1/2008 | Ishii | G03F 9/7011 |
| | | | | 356/400 |
| 2008/0199980 | A1* | 8/2008 | Okayama | G01R 35/00 |
| | | | | 438/16 |
| 2010/0026997 | A1 | 2/2010 | Hayashi et al. | |
| 2010/0074516 | A1* | 3/2010 | Kawaragi | G01N 21/956 |
| | | | | 382/149 |
| 2010/0231927 | A1 | 9/2010 | Nacke et al. | |
| 2011/0141272 | A1* | 6/2011 | Uto | G01N 21/9501 |
| | | | | 348/135 |
| 2016/0314577 | A1* | 10/2016 | Lee | H01L 22/12 |

FOREIGN PATENT DOCUMENTS

| | | |
|---|---|---|
| JP | 2004-219255 | 8/2004 |
| JP | 2005-055756 | 3/2005 |
| JP | 2007-163265 | 6/2007 |
| JP | 2007-258064 A | 10/2007 |
| JP | 2008-537316 | 9/2008 |
| JP | 2009-058530 A | 3/2009 |
| JP | 2011-085410 | 4/2011 |
| KR | 10-2007-0120414 A | 12/2007 |
| KR | 10-2009-0100957 A | 10/2009 |
| KR | 10-2013-0100259 | 9/2013 |
| WO | WO 2012/005019 A1 | 1/2012 |

OTHER PUBLICATIONS

European Search Report dated May 16, 2017 issued in Application No. 14875737.0.
International Search Report dated Oct. 27, 2014 issued in Application No. PCT/KR2014/005620.
Korean Office Action dated Dec. 26, 2014.
Korean Notice of Allowance dated Jun. 29, 2015.
Japanese Office Action dated Jun. 19, 2017.

* cited by examiner

[FIG. 1]

[FIG. 3]
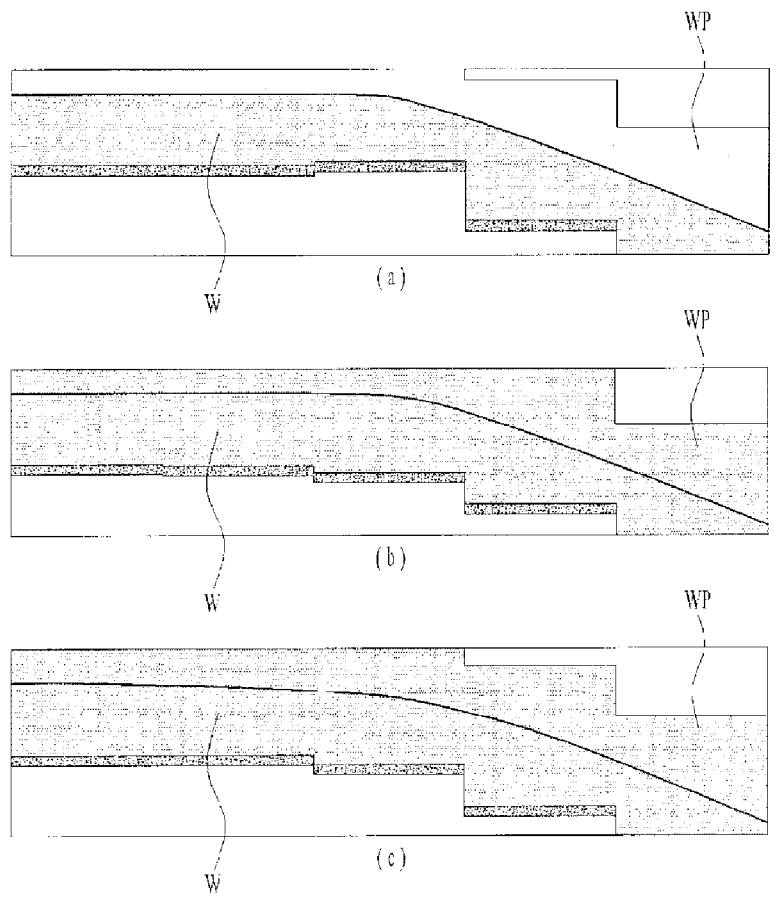
[FIG. 4]
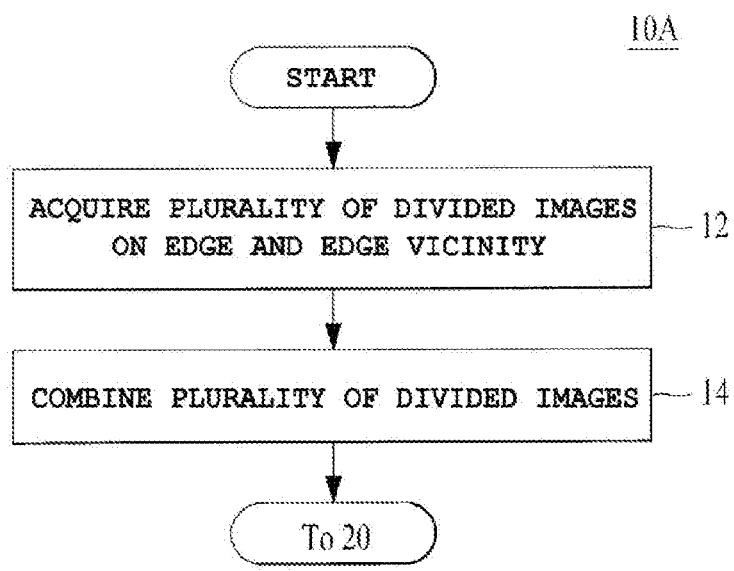

【FIG. 5】
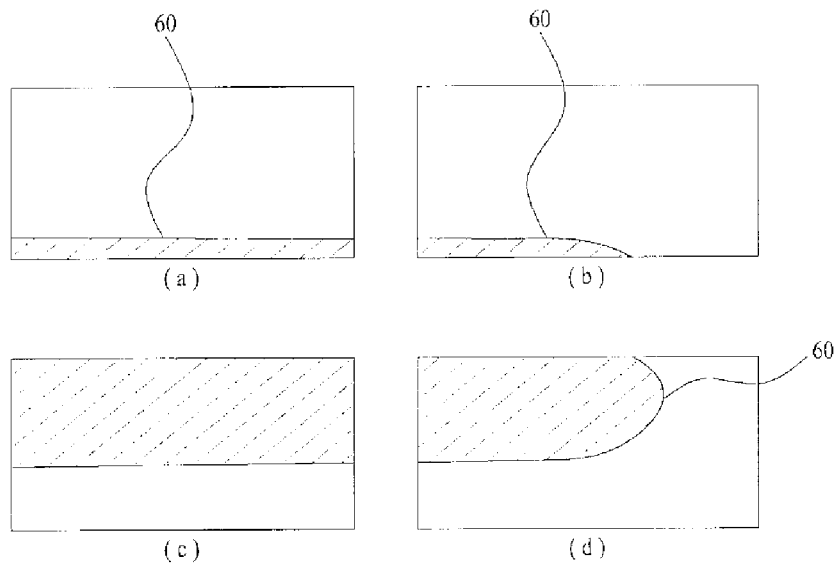
【FIG. 6】
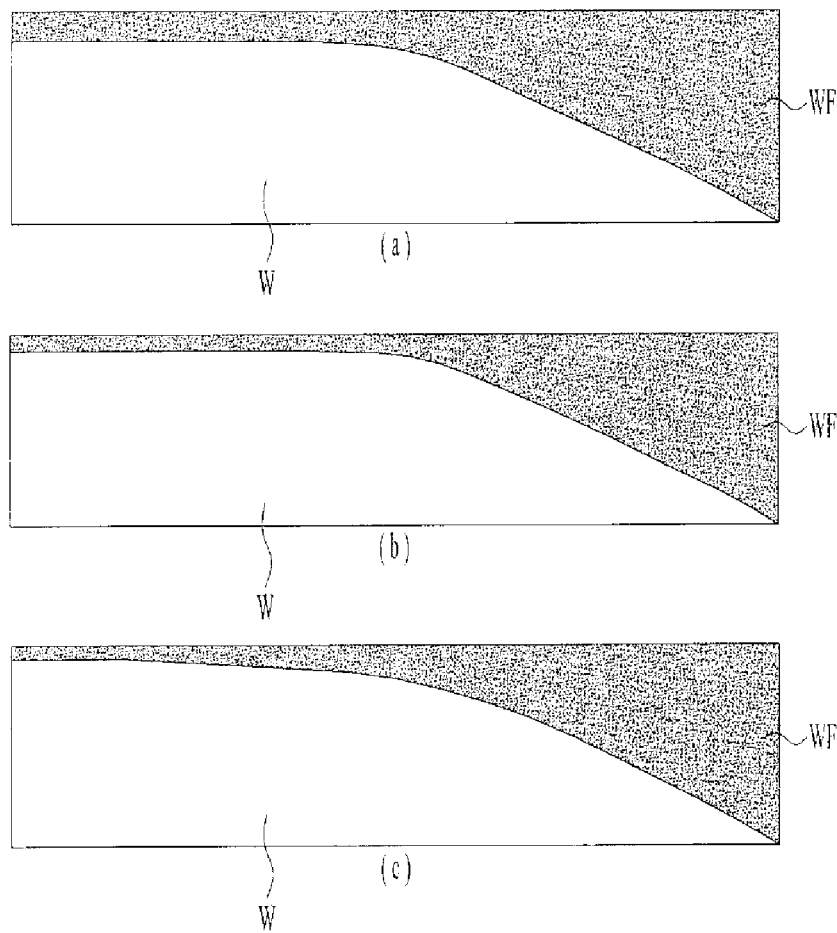

[FIG. 7]
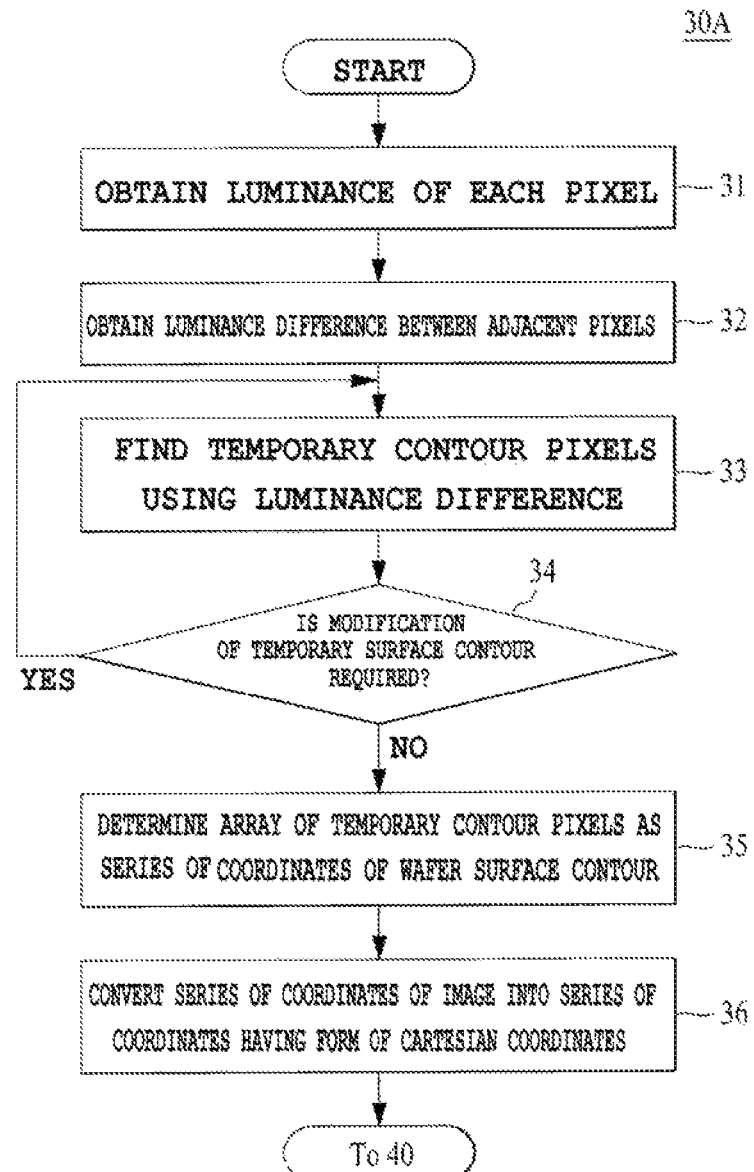

[FIG. 8]
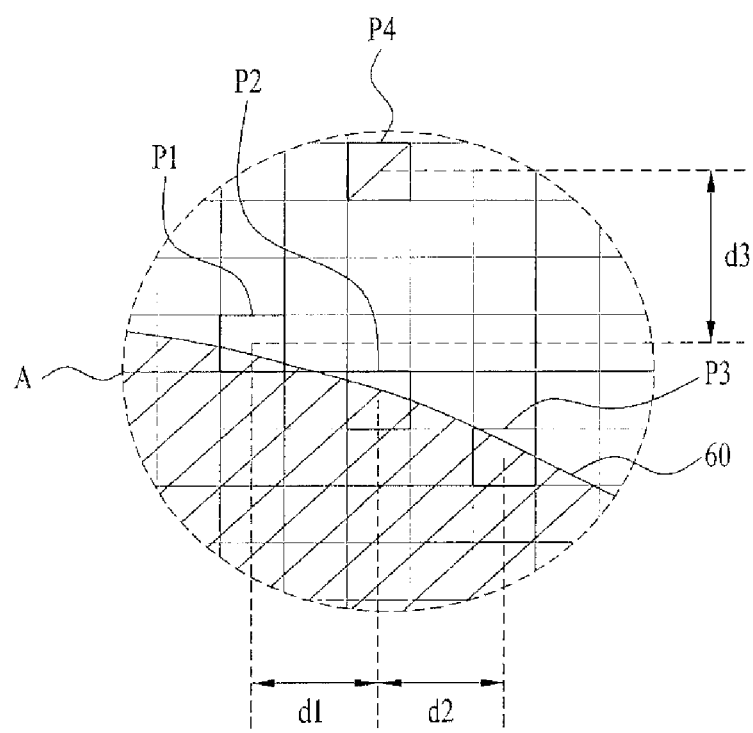

[FIG. 9]
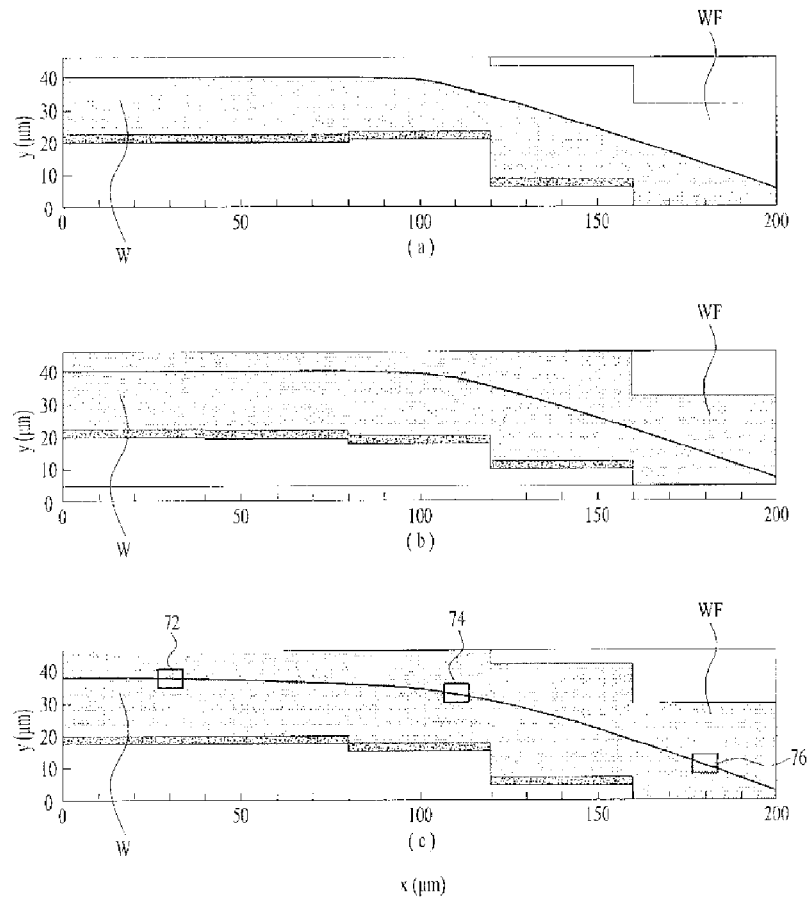
[FIG. 10]
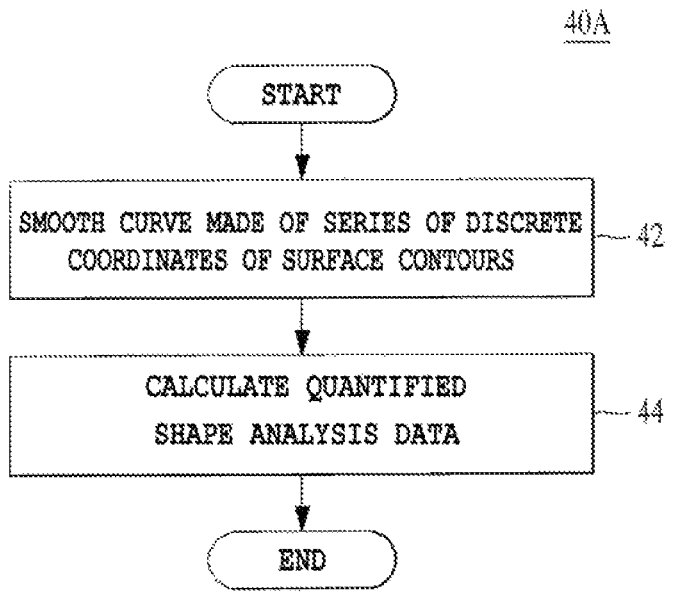

[FIG. 11a]
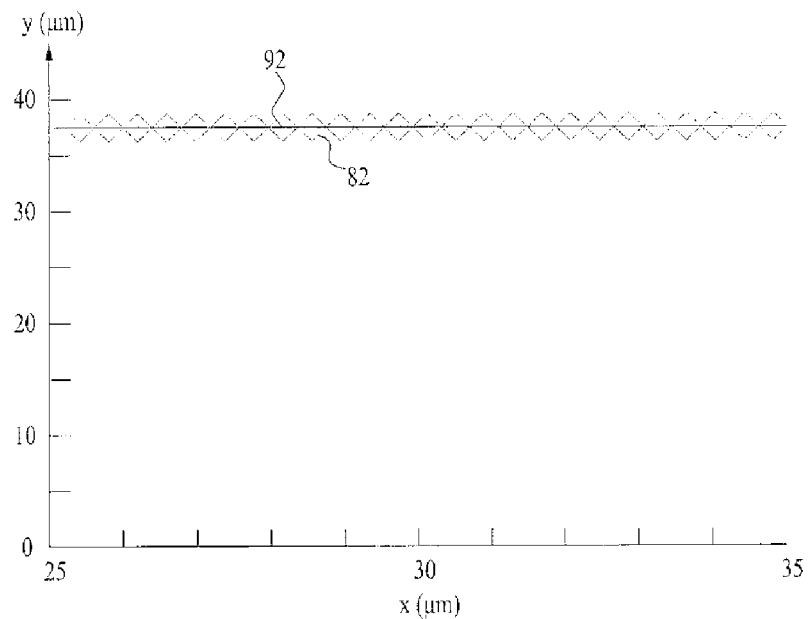
[FIG. 11b]
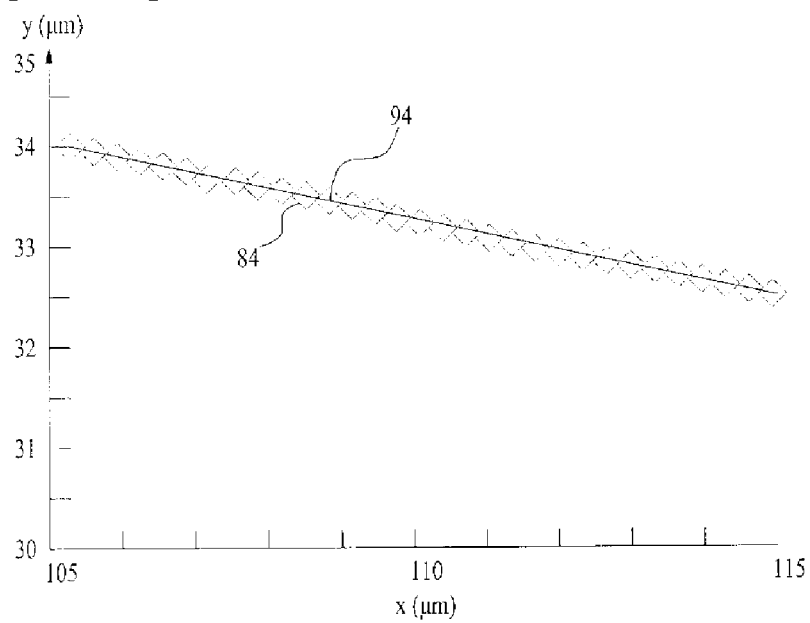

[FIG. 11c]
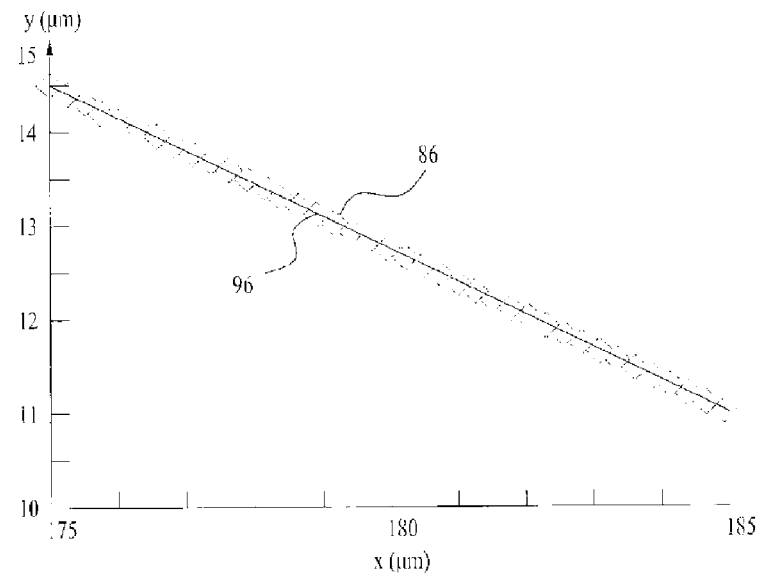
[FIG. 12]
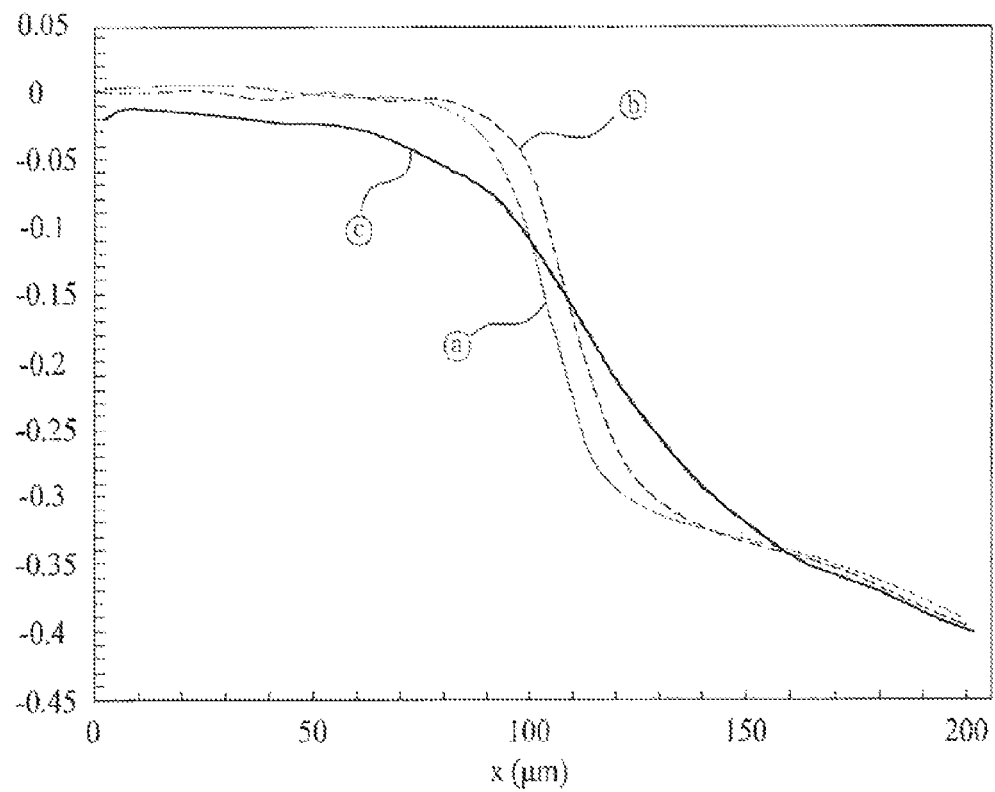

[FIG. 13]
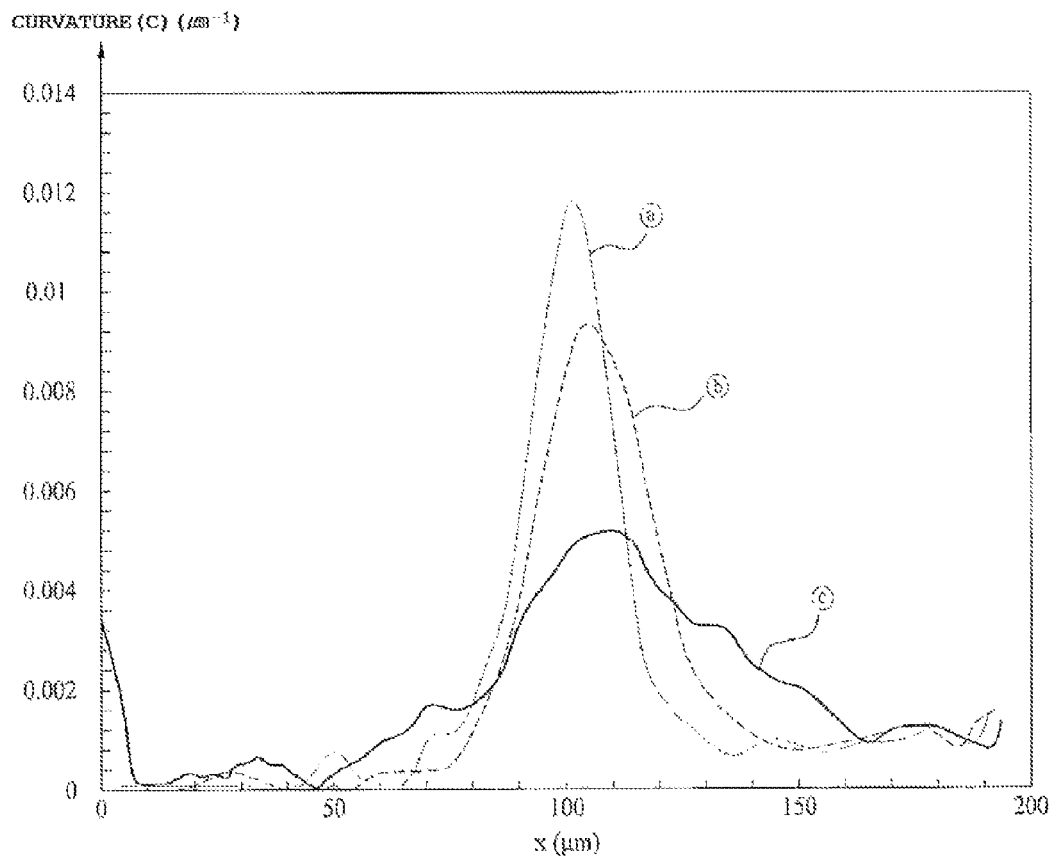
[FIG. 14]
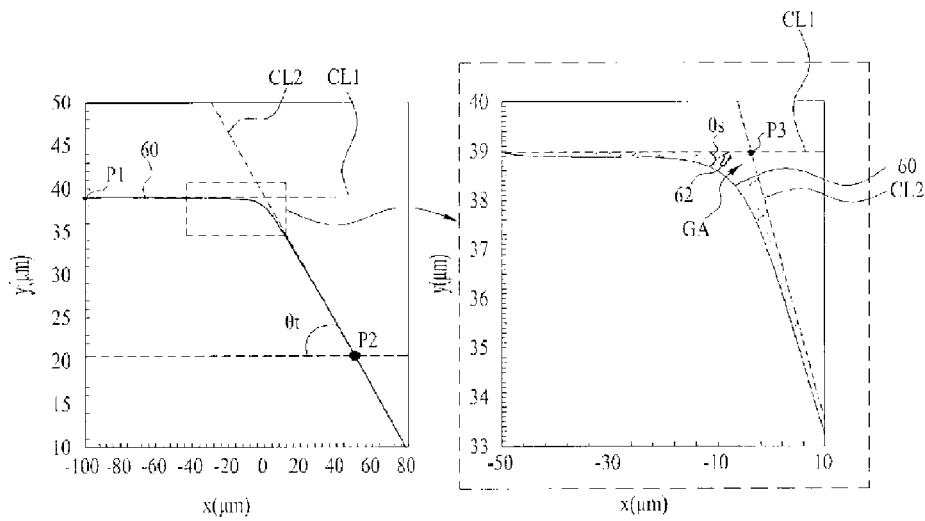

[FIG. 15]
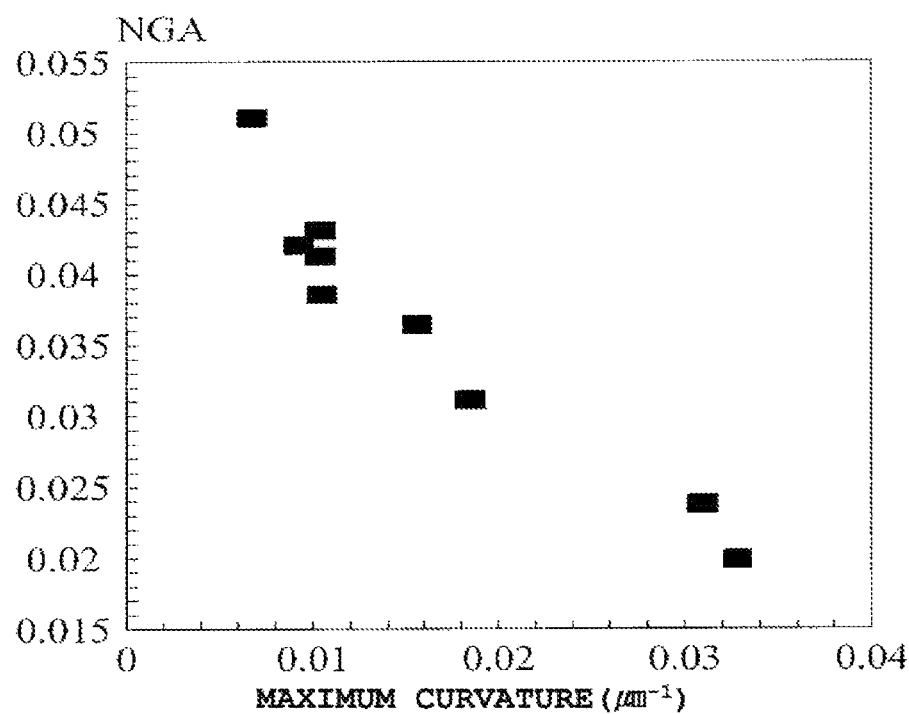
[FIG. 16]
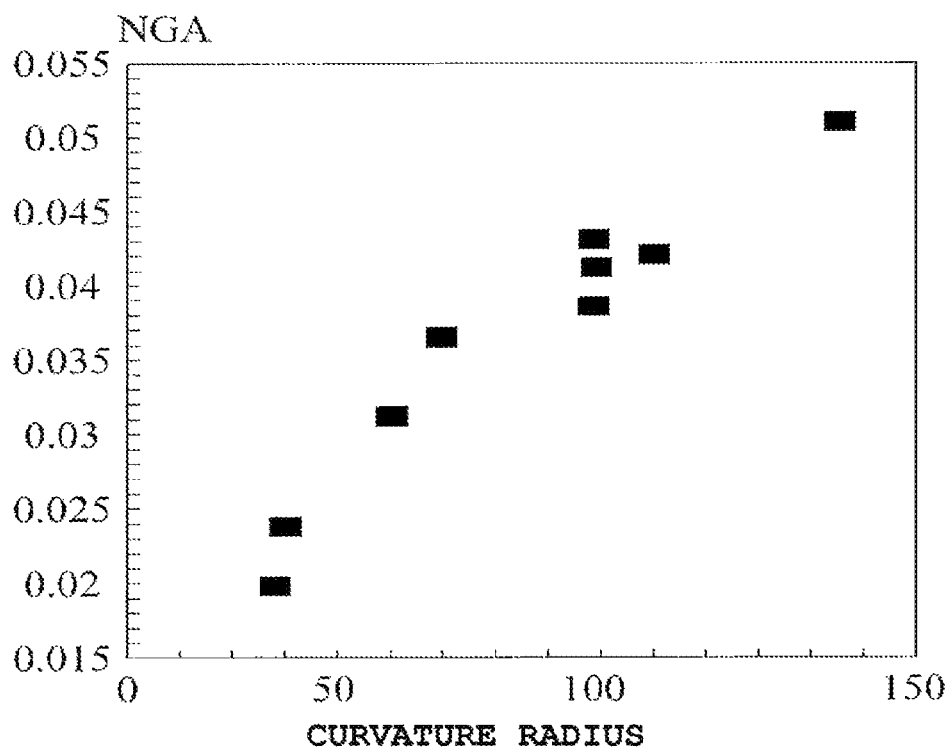

[FIG. 17]
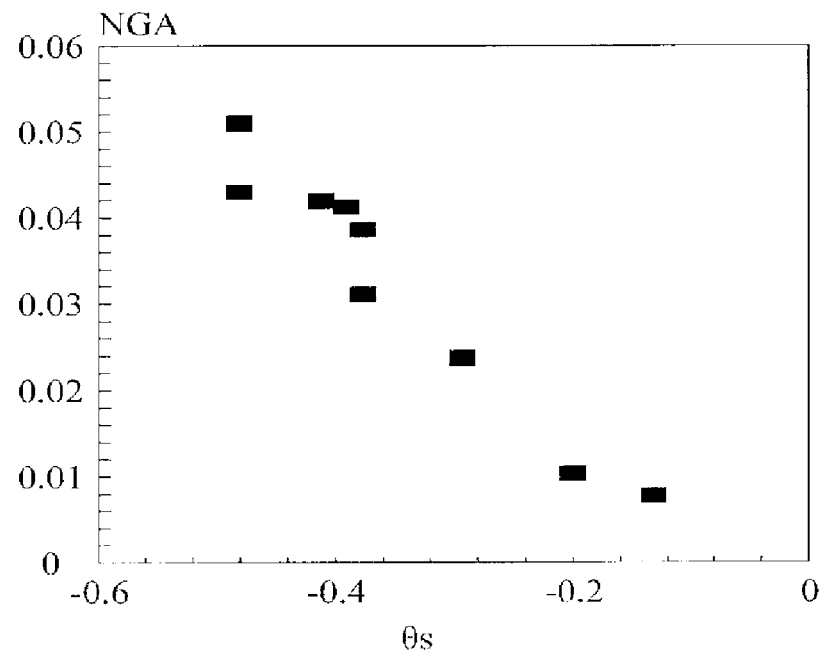
[FIG. 18]
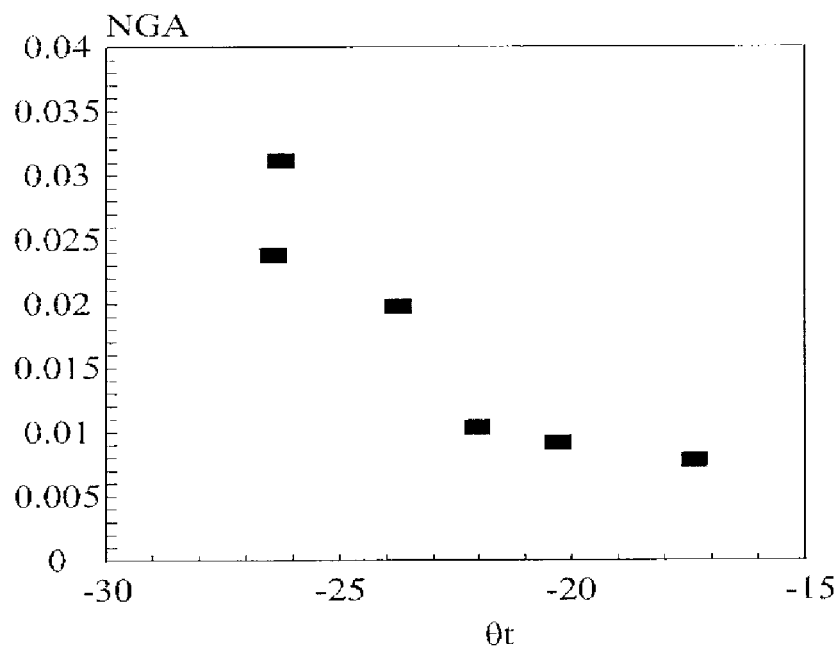

[FIG. 19]
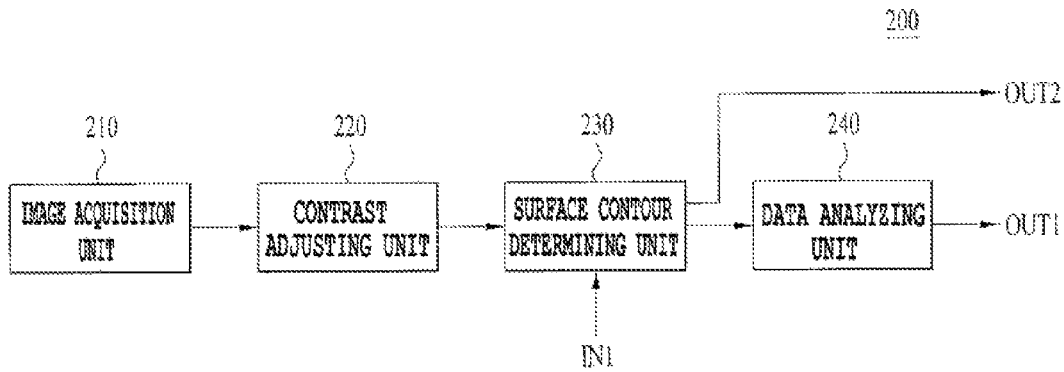
[FIG. 20]
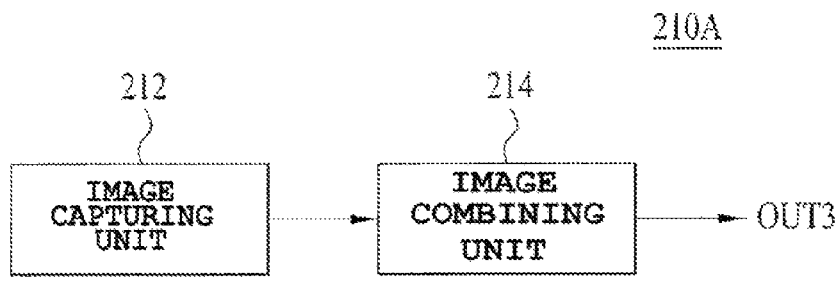
[FIG. 21]
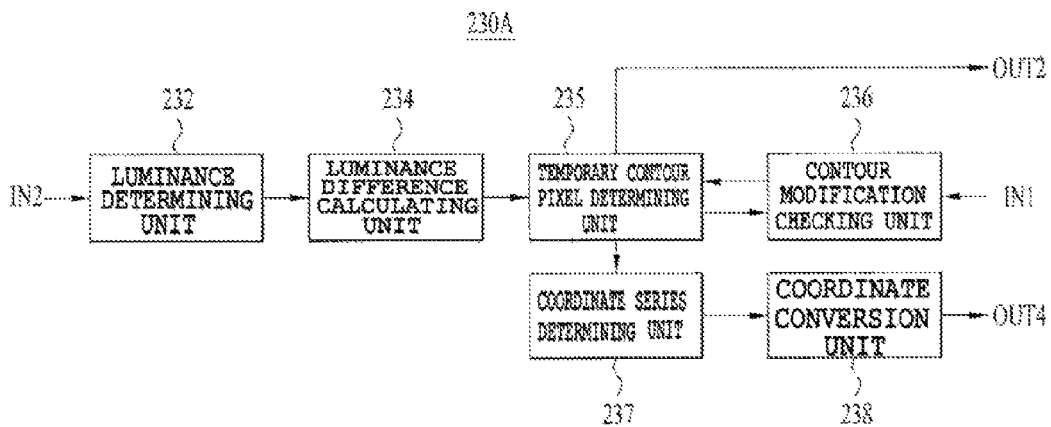

[FIG. 22]
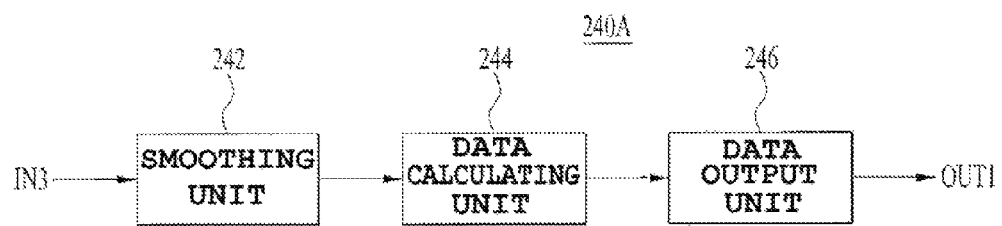

METHOD AND APPARATUS FOR ANALYZING SHAPE OF WAFER

CROSS-REFERENCE TO RELATED PATENT APPLICATIONS

This application is a U.S. National Stage Application under 35 U.S.C. §371 of PCT Application No. PCT/KR2014/005620, filed Jun. 25, 2014, which claims priority to Korean Patent Application No. 10-2013-0162085, filed Dec. 24, 2013, whose entire disclosures are hereby incorporated by reference.

TECHNICAL FIELD

The embodiment relates to a method and apparatus of analyzing a shape of a wafer.

BACKGROUND

Semiconductor devices are formed on a wafer. In this case, in order to achieve high integration and high yields of the semiconductor devices, it is required for an edge of the wafer to have high purity and an appropriate shape suitable for a method of manufacturing the semiconductor device. To this end, a practical and easy method of analyzing a shape of an edge of a wafer is required. For example, one of the most important mathematical parameters of the shape of the edge of the wafer is a curvature, and an overall curvature formed by the edge of the wafer and a front surface of the wafer should be as small as possible. This is because the front surface of the wafer and the edge of the wafer are smoothly formed without a boundary with each other when the curvature is small.

However, when the curvature formed by the edge and the front surface of the wafer is not small, a critical problem in that the wafer may be non-uniformly coated with a photoresist (PR) and the like may occur in a process for manufacturing the semiconductor device on the wafer.

In one conventional method of analyzing a shape of an edge of a wafer, roughness of a surface of the wafer is analyzed through optical principles such as laser scattering and the like. However, in such conventional methods, not only expensive equipment which is elaborately aligned is requested but also there is a technical burden of a smaller size of a laser spot in order to perform extremely precise analysis corresponding to the calculation of a curvature of the edge.

DISCLOSURE

Technical Problem

The embodiment is directed to providing a method and apparatus of analyzing a shape of a wafer in which the shape of the wafer can be simply analyzed through an image processing technique without the aid of separate apparatuses such as a laser and the like.

Technical Solution

One aspect of the present invention provides a method of analyzing a shape of a wafer including acquiring a sectional image showing a wafer to be analyzed, finding a series of coordinates of a surface contour of the wafer in the sectional image, and obtaining shape analysis data including information on a shape of the wafer using the series of coordinates.

The sectional image may show an edge of the wafer and an edge vicinity, and the shape of the wafer may include shapes of the edge and the edge vicinity.

The acquiring of the sectional image may include capturing the edge and the edge vicinity of the wafer using an electron microscope. Each of a horizontal size and a vertical size of each pixel in the sectional image may be less than or equal to 1% of a size of the shape of the wafer. Further, each of the horizontal size and the vertical size of each of the pixels in the sectional image may be in a range of 0.25 μm to 2 μm.

The acquiring of the sectional image may include acquiring a plurality of divided images by capturing the edge and the edge vicinity several times, and acquiring the sectional image by combining the plurality of divided images.

The combining of the plurality of divided image may include analyzing a luminance of each of the plurality of divided images, overlapping intervals having a similar luminance, and acquiring the sectional image.

The method of analyzing the shape of the wafer may further include increasing a contrast between the wafer and a periphery of the wafer in the sectional image, and the series of coordinates of the surface contour may be found in the sectional image in which the contrast is increased.

The finding of the series of coordinates of the surface contour may include obtaining a luminance of each pixel in the sectional image, obtaining luminance differences between adjacent pixels, determining temporary contour pixels using the luminance differences, re-determining the temporary contour pixels when modification of a temporary surface contour formed by the temporary contour pixels is required, and determining an array of the temporary contour pixels as the series of coordinates of the surface contour when the modification of the temporary surface contour is not required.

The determining of the temporary contour pixels may include finding the adjacent pixels showing a relatively large luminance difference among the luminance differences and determining the found adjacent pixels as the temporary contour pixels.

The determining of the temporary contour pixels may include listing the luminance differences in order from largest to smallest and determining pixels showing top level luminance differences in all the listed luminance differences as the temporary contour pixels.

The modification of the temporary surface contour may be required by an operator.

The modification of the temporary surface contour may be determined to be required when an interval between the temporary contour pixels is out of a threshold distance. The threshold distance may be in a range of 1 pixel to 100 pixels. The threshold distance may be a distance within 10% of a distance from the temporary surface contour. The threshold distance may be a distance corresponding to 1% of a size of the shape of the wafer.

The finding of the series of coordinates of the surface contour may further include converting the array of the temporary contour pixels determined as the series of coordinates of the surface contour into a series of coordinates having a form of Cartesian coordinates.

The luminance difference may be determined as a relatively large luminance difference when the luminance difference is out of a threshold luminance range. The threshold luminance range may be in a range of a gray scale of 0.01 to a gray scale of 0.1.

The obtaining of the shape analysis data may include smoothing a curve made of a series of discrete coordinates of the surface contour and calculating the shape analysis data using the smoothed curve.

The shape analysis data may include a curvature formed by both of the edge and the edge vicinity.

The shape analysis data may include a normalized gap area obtained by normalizing a gap area derived from an unprocessed area and a processed area.

Another aspect of the present invention provides a wafer shape analyzing apparatus including an image acquisition unit which acquires a sectional image showing a wafer to be analyzed, a surface contour determining unit which finds a series of coordinates of a surface contour of the wafer in the sectional image output from the image acquisition unit, and a data analyzing unit which calculates shape analysis data including information on a shape of the wafer using the series of coordinates output from the surface contour determining unit.

The sectional image may show an edge of the wafer and an edge vicinity, and the shape of the wafer may include shapes of the edge and the edge vicinity.

The image acquisition unit may include an image capturing unit which captures the edge and the edge vicinity of the wafer several times and an image combining unit which combines a plurality of divided images which are captured in the image capturing unit several times and generates the sectional image.

The wafer shape analyzing apparatus may further include a contrast adjusting unit which increases a contrast between the wafer and a periphery of the wafer in the sectional image and outputs the sectional image having the increased contrast to the surface contour determining unit, and the surface contour determining unit may find the series of coordinates in the sectional image having the increased contrast output from the contrast adjusting unit.

The surface contour determining unit may include a luminance determining unit which determines a luminance of each pixel in the sectional image, a luminance difference calculating unit which receives the luminance output from the luminance determining unit and calculates luminance differences between adjacent pixels, a temporary contour pixel determining unit which determines temporary contour pixels using the calculated luminance differences, and re-determines the temporary contour pixels or outputs the temporary contour pixels in response to a modification request signal, a contour modification checking unit which checks whether modification of the temporary surface contour formed by the temporary contour pixels is required and generates the modification request signal, and a coordinate series determining unit which determines an array of the temporary contour pixels received from the temporary contour pixel determining unit as the series of coordinates of the surface contour of the wafer and outputs the series of determined coordinates.

The temporary contour pixel determining unit may find adjacent pixels showing a relatively large luminance difference among the calculated luminance differences and determine the found adjacent pixels as the temporary contour pixels.

The temporary contour pixel determining unit may list the calculated luminance differences in order from largest to smallest and determine pixels showing top level luminance differences in all the listed luminance differences as the temporary contour pixels.

The contour modification checking unit may determine whether the modification of the temporary surface contour is required by an operator or an interval between the temporary contour pixels is out of a threshold distance, and generate the modification request signal.

The surface contour determining unit may further include a coordinate conversion unit which converts an array of the temporary contour pixels determined as the series of coordinates of the surface contour into a series of coordinates having a form of Cartesian coordinates and outputs the series of converted coordinates.

The data analyzing unit may include a smoothing unit which smooths a curve made of a series of discrete coordinates of the surface contour, a data calculating unit which calculates the shape analysis data using the smoothed curve, and a data output unit which outputs a result calculated in the data calculating unit as the shape analysis data.

Advantageous Effects

According to the method and apparatus of analyzing the shape of the wafer according to the embodiments, shape analysis data related to the shape of the wafer can be quantified and represented by mathematically processing the curve, because a high-resolution sectional image on a shape of a wafer such as shapes of an edge and an edge vicinity of the wafer may be acquired, a series of coordinates of a surface contour of the wafer may be obtained in the acquired sectional image, and the obtained series of coordinates may be represented as a curve in a mathematical coordinate system, thus various factors that define the shape of the wafer as well as a curvature can be easily analyzed without the aid of separate measuring apparatuses.

DESCRIPTION OF DRAWINGS

FIGS. 3(a) to 3(c) are views illustrating samples of three sectional images having curvatures different from one another.

FIG. 4 is a flowchart for describing an embodiment of Operation S10 illustrated in FIG. 1.

FIGS. 5(a) to 5(d) are views to help understanding of divided images in example.

FIGS. 6(a) to 6(c) are views illustrating states in which contrasts of the sectional image samples illustrated in FIGS. 3(a) to 3(c) are increased, respectively.

FIG. 7 is a flowchart for describing an embodiment of Operation S30 illustrated in FIG. 1.

FIG. 8 is an enlarged view illustrating portion 'A' illustrated in FIG. 2.

FIGS. 9(a) to 9(c) are views illustrating sectional images obtained by performing Operation S30 on the sectional images illustrated in FIGS. 6(a) to 6(c), respectively.

FIG. 10 is a flowchart for describing an embodiment of Operation S40 illustrated in FIG. 1.

FIGS. 11a to 11c are graphs for describing processes of smoothing portions illustrated in FIGS. 9(a) to 9(c), respectively.

FIG. 12 is a graph illustrating results that a first differentiation is performed on results that curves made of a series of discrete coordinates in the sectional images illustrated in FIGS. 9(a) to 9(c) are smoothed.

FIG. 13 is a graph illustrating curvatures obtained by substituting results that curves made of a series of discrete coordinates in the sectional images illustrated in FIGS. 9(a) to 9(c) are smoothed, into Equation 1.

FIG. 14 is a view illustrating an example of a smoothed curve for describing a normalized gap area.

FIG. 15 is a graph illustrating a relationship between a normalized gap area and a maximum curvature of an edge.

FIG. 16 is a graph illustrating a relationship between a normalized gap area and a curvature radius of an edge.

FIG. 17 is a graph illustrating a relationship between a normalized gap area and a slope angle.

FIG. 18 is a graph illustrating a relationship between a normalized gap area and a taper angle.

FIG. 19 is a block diagram of a wafer shape analyzing apparatus according to an embodiment.

FIG. 20 is a block diagram of an embodiment of an image acquisition unit illustrated in FIG. 19.

FIG. 21 is a block diagram of an embodiment of a surface contour determining unit illustrated in FIG. 19.

FIG. 22 is a block diagram illustrating an embodiment of a data analyzing unit illustrated in FIG. 19.

MODES OF THE INVENTION

Hereinafter, embodiments are provided in order to fully explain the invention, and will be described in detail with reference to accompanying drawings to help understanding of the invention. The embodiments may, however, be embodied in many different forms and the scope of the present invention is not to be construed as being limited to the embodiments set forth herein; rather, these embodiments of the present invention are provided in order to more thoroughly and completely convey the concept of the present invention to those skilled in the art.

Hereinafter, a method of analyzing a shape of a wafer according to embodiments will be described as follows with reference to accompanying drawings. Further, hereinafter, although an edge of a wafer, among shapes of the wafer such as a wafer edge, a wafer surface, a wafer back surface, and the like which may be acquired as an image, will be described in the embodiments as an example, the present embodiment may also be applied to another shape of the wafer such as the wafer surface, the wafer back surface, and the like other than the wafer edge.

Figure 1:
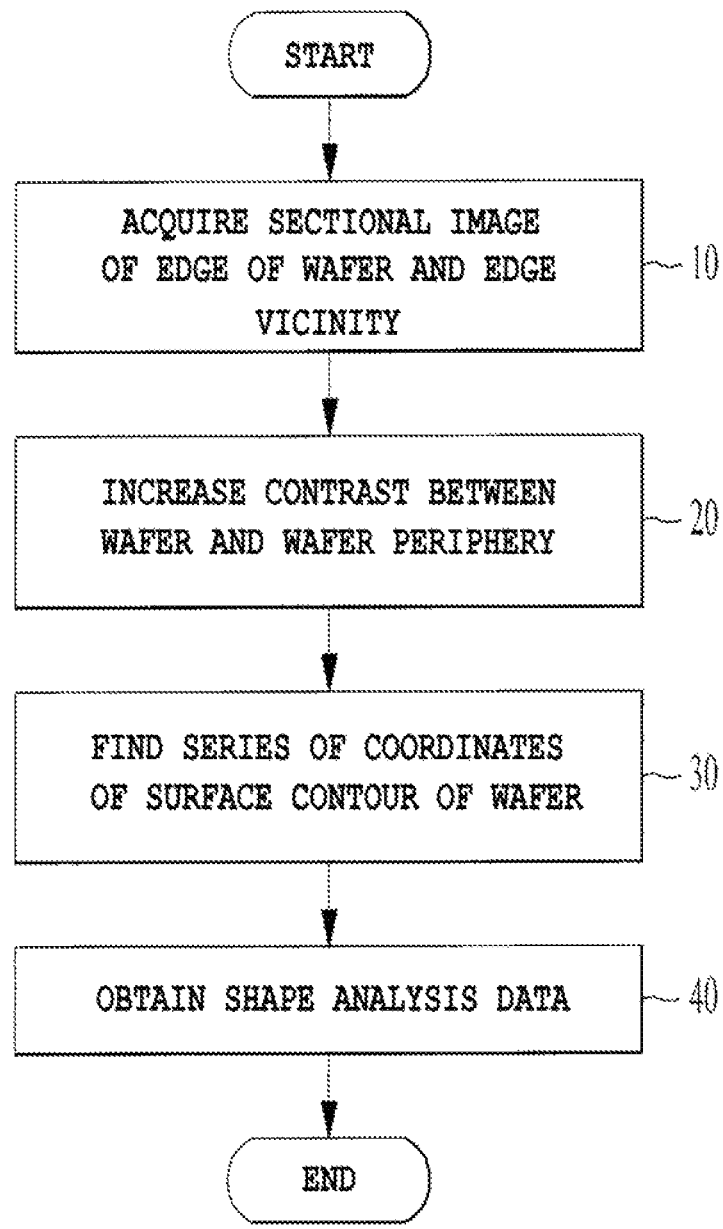
FIG. 1 is a flowchart for describing a method of analyzing a shape of a wafer according to an embodiment of the present invention.

FIG. 1 is a flowchart for describing a method of analyzing a shape of a wafer according to an embodiment of the present invention.

Figure 2:
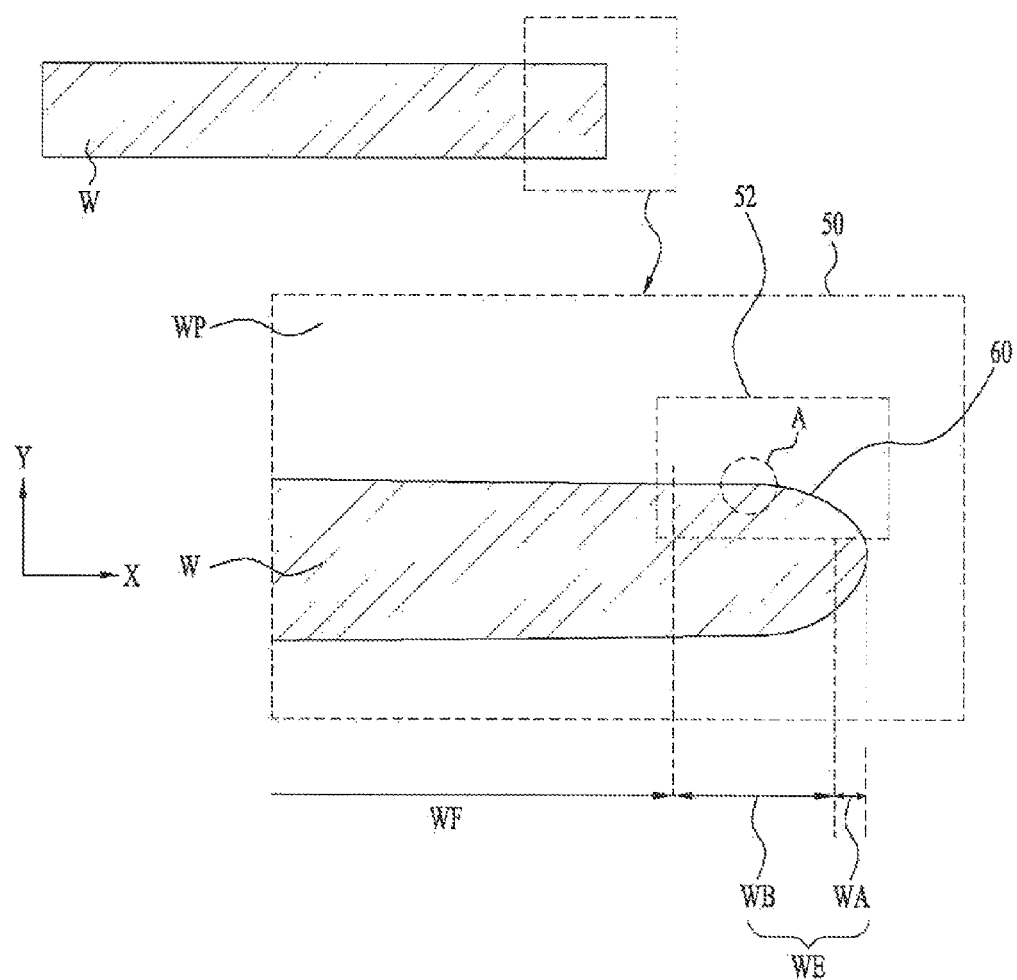
FIG. 2 is a view and an enlarged sectional view illustrating a wafer of which a shape is analyzed by the method illustrated in FIG. 1.

FIG. 2 is a view illustrating a wafer W of which a shape is analyzed by the method illustrated in FIG. 1 and a locally enlarged cross sectional view 50 of the wafer W. Hereinafter, a periphery of the wafer W is referred to as a wafer periphery (WP).

Referring to FIGS. 1 and 2, in the method of analyzing the shape of the wafer according to the embodiment, first, a sectional image showing a shape of the wafer W is acquired (S10). Here, the shape of the wafer W shown in the acquired sectional image of the wafer W may include shapes of an edge WE (a wafer edge) of the wafer W and an edge vicinity WF (a wafer front).

To this end, for example, an analysis method in which cross sectional image may be obtained such as a focused ion beam (FIB) technique may be applied.

In the sectional image acquired in Operation S10, the edge vicinity WF corresponds to a front side of the wafer W and is disposed in a vicinity of the edge WE. Further, the edge WE may be divided into a bevel portion WB (a wafer bevel) and an apex WA (a wafer apex). The bevel portion WB refers to an inclined portion of the edge WE. That is, the bevel portion WB refers to a flat and inclined portion appearing across a point having a maximum curvature at the front side WF of the wafer W. The apex WA refers to an endmost portion protruding from a side of the wafer W.

As illustrated in FIG. 2, an end of the edge WE may be symmetrical based on a center of a thickness of the wafer W.

Hereinafter, in order to help understanding of the present invention, although the embodiment is described with reference to three exemplary sectional images having different edge shapes, the embodiment may also be applied to sectional images different from the exemplary sectional images in the same manner.

FIGS. 3(a) to 3(c), which are views illustrating samples of three sectional images having curvatures different from one another, are views illustrating image samples in which only a portion 52 of the sectional image illustrated in FIG. 2 is enlarged.

In the sample of each of the sectional images in FIGS. 3(a) to 3(c), W represents a portion corresponding to the wafer, and WP represents a portion corresponding to the periphery of the wafer. In the samples of the three sectional images, a curvature of the wafer illustrated in FIG. 3(a) is the largest, a curvature of the wafer illustrated in FIG. 3(c) is the smallest, and a curvature of the wafer illustrated in FIG. 3(b) is the middle of the curvatures of the wafers illustrated in FIG. 3(a) and FIG. 3(c).

According to an embodiment of Operation S10, a sectional image including the edge WE of the wafer W and the edge vicinity WF may be accurately captured using an electron microscope such as a scanning electron microscope (SEM) or a transmission electron microscope (TEM).

Further, a sectional image may be obtained by capturing the wafer W one time. Or, after capturing the wafer W several times, a sectional image showing the best resolution may also be selected. For example, as illustrated in FIGS. 3(a) to 3(c), the samples of the three sectional images may be acquired by capturing the portion 52 illustrated in FIG. 2.

Further, the acquired sectional images may be observed at high resolution. For example, in order to acquire a sectional image having high resolution, each of a horizontal size and a vertical size of each pixel in the sectional image may be less than or equal to 1% of a size of a shape of the wafer, and preferably, may be in a range of 0.25 μm to 2 μm.

FIG. 4 is a flowchart for describing an embodiment 10A of Operation S10 illustrated in FIG. 1.

FIGS. 5(a) to 5(d) are views to help understanding of divided images in example.

According to another embodiment 10A in Operation S10, a plurality of divided images of the edge WE and the edge vicinity WF are acquired (S12). For example, when the sectional image to be acquired in Operation S10 is assumed to be a portion 50 illustrated in FIG. 2, a plurality of divided images illustrated in FIGS. 5(a) to 5(d) may be acquired by capturing the wafer W several times. Here, the plurality of divided images may be acquired by the electron microscope as described above. Although only four divided images are illustrated in FIGS. 5(a) to 5(d) as an example, the embodiment is not limited thereto. That is, four or more divided images or four or less divided images may be acquired.

After Operation S12 is performed, the sectional image is obtained by combining the plurality of divided images (S14).

According to an embodiment, the sectional image 50 illustrated in FIG. 2 may be acquired by combining the plurality of divided images illustrated in FIGS. 5(a) to 5(d).

According to another embodiment, in the same manner as a method of finding a series of coordinates of a surface contour of a wafer W in Operation S30, which will be described below, a luminance of each of the plurality of divided images are analyzed so that intervals having a similar luminance overlap, and thus the sectional image 50 may also be acquired. As described above, the sectional image obtained by the combining of the plurality of divided images may have higher resolution than the sectional image captured at one time.

Meanwhile, after Operation S10 is performed, a contrast between the wafer W and the wafer periphery WP in the sectional image is increased (S20). When Operation S20 is performed, the series of coordinates of the surface contour of the wafer W may be found reliably in Operation S30, which will be described below. Here, referring to FIG. 2, the 'surface contour of the wafer W' refers to a boundary 60 between the wafer W and the wafer periphery WP. The boundary 60 extends over the edge vicinity WF and the edge WE.

FIGS. 6(a) to 6(c) are views illustrating states in which contrasts of sectional image samples illustrated in FIGS. 3(a) to 3(c) are increased, respectively.

For example, when the contrasts of the sectional images illustrated in FIGS. 3(a) to 3(c) are increased, the wafer W represented by a white color and the periphery WF of the wafer W represented by a black color may be clearly distinguished as illustrated in FIGS. 6(a) to 6(c).

In some cases, in the method of analyzing the shape of the wafer according to the embodiment, Operation S20 may not be performed and may be omitted.

Referring again to FIG. 1, after Operation S20 is performed, the series of coordinates of the surface contour of the wafer W is found in the sectional image in which the contrast is increased (S30).

For example, the series of coordinates of the surface contour of the wafer W may be found using each of the sectional images illustrated in FIGS. 6(a) to 6(c), in which the contrast is increased. However, when Operation S20 is omitted, the series of coordinates of the surface contour of the wafer W may be found using each of the sectional images illustrated in FIGS. 3(a) to 3(c).

FIG. 7 is a flowchart for describing an embodiment 30A of Operation S30 illustrated in FIG. 1.

Referring to FIG. 2, adjacent pixels positioned at the surface contour 60 of the wafer W may have a greater luminance difference than adjacent pixels positioned in the wafer W or adjacent pixels positioned in the wafer periphery WP. Using points as described above, the series of coordinates of the surface contour of the wafer W may be obtained as follows.

Referring to FIG. 7, first, a luminance of each of the pixels of the sectional image is obtained (S31).

After Operation S31 is performed, luminance differences between adjacent pixels are obtained (S32). After Operation S32 is performed, temporary contour pixels are searched using the luminance differences (S33).

According to an embodiment, adjacent pixels showing a relatively large luminance difference among the luminance differences may be found, and the found adjacent pixels may be determined as the temporary contour pixels (S33). To this end, for example, whether the luminance difference is out of a threshold luminance range may be determined, and the luminance difference which is out of the threshold luminance range may be determined as the relatively large luminance difference. For example, the threshold luminance range may be a range of a gray scale of 0.01 to a gray scale of 0.1. In this case, Operations S32 and S33 may be performed on all the pixels included in the sectional image, but the embodiment is not limited thereto.

According to another embodiment, the sectional image may be grouped, a distribution of the luminance of each group in the sectional image may be obtained, and Operations S32 and S33 may be performed on only a group having a greater distribution of the luminance than that of other groups. This is because the distribution of the luminance of the pixels belonging to a group not including the surface contour of the wafer W is not large. In this case, Operations S32 and S33 may be performed within a much faster time than when Operations S32 and S33 are performed on all the pixels included in the sectional image.

According to still another embodiment, after Operation S32 is performed, the luminance differences may be listed in order from largest to smallest, and pixels showing top level luminance differences in all the listed luminance differences may be determined as the temporary contour pixels. For example, the pixels showing top level luminance differences in a range of the top several % to several tens of % in all the listed luminance differences may be determined as the temporary contour pixels.

After Operation S33 is performed, whether modification of a temporary surface contour made of the determined temporary contour pixels is required is determined (S34).

According to an embodiment, when the temporary surface contour formed by the temporary contour pixels is provided to an operator, the operator may examine the provided temporary surface contour with the naked eye. As a result of the examination with the naked eye, when the operator is determined that the temporary surface contour was determined incorrectly, the operator may require a modification of the temporary surface contour. For example, when the temporary surface contour is cut, is generated as a plurality of lines for example, two lines, or has a bad point, the operator may determine that the temporary surface contour is incorrect, and may require a modification of the temporary surface contour.

FIG. 8 is an enlarged view illustrating portion 'A' illustrated in FIG. 2.

According to another embodiment, Operation S34 may be performed without the operator's intervention. That is, when an interval between the temporary contour pixels constituting the temporary surface contour is out of a threshold distance, it may be determined that the modification of the temporary surface contour is required. Referring to FIG. 8, pixels P1 to P4 are assumed to be determined as the temporary contour pixels in Operation S33. In this case, intervals d1 and d2 between the temporary contour pixels P1, P2, and P3 disposed in contact with the wafer surface contour 60 are smaller than an interval d3 between the temporary contour pixel P4 disposed away from the wafer surface contour 60 and another temporary contour pixel (e.g., P1). In this way, the threshold distance may be determined so that modification of the temporary contour pixels P4 disposed spaced far apart from the wafer surface contour 60 may be required. For example, the threshold distance may be in a range of 1 pixel to 100 pixels. Alternatively, the threshold distance may be a distance within 10% of that from the temporary surface contour 60.

Alternatively, the threshold distance may be a distance corresponding to 1% of a size of the shape of the wafer W.

When the modification of the temporary surface contour is required, the temporary contour pixels are re-determined by proceeding to Operation S33 (S33).

However, when the modification of the temporary surface contour is not required, an array of the temporary contour pixels determined in Operation S33 is determined as a series of coordinates of the wafer surface contour 60 (S35).

Eventually, according to the method of analyzing the shape of the wafer according to the embodiment, as above-described Operations S31 to S35 are performed, pixels having the largest contrast between white and black in the sectional image are found as the series of coordinates of the wafer surface contour 60.

After Operation S35 is performed, the array of the temporary contour pixels determined as the series of coordinates of the surface contour 60 of the wafer W is converted into a series of coordinates having a form of Cartesian coordinates (S36). Here, the Cartesian coordinates refers to coordinates represented in a mathematical coordinate system, for example, an X-Y coordinate system, an r-θ coordinate system, a pφθ coordinate system, or the like.

In this way, as the array of the temporary contour pixels is converted into the Cartesian coordinates, the shape of the wafer W may be quantified and may be represented numerically.

FIGS. 9(a) to 9(c) are views illustrating the sectional images obtained by performing Operation 30 on the sectional images illustrated in FIGS. 6(a) to 6(c), respectively.

The array of the temporary contour pixels determined as the series of coordinates of the wafer surface contour 60 is image coordinates. That is, while the image coordinates set an upper left corner as a reference point (0, 0) in a coordinate system, the Cartesian coordinates set a lower left corner as a reference point (0, 0) in a first quadrant of a coordinate system. For example, when the series of coordinates of the surface contour 60 of the wafer W determined after Operations S31 to S35 are performed on the sectional images illustrated in FIGS. 6(a) to 6(c) is converted into a Cartesian coordinate system, a lower left corner in a first quadrant of a series of Cartesian coordinates may be a reference point (0, 0) as illustrated in FIGS. 9(a) to 9(c).

Further, the above-described Operation S30 may be performed programmatically by a program stored in a computer-readable recording medium.

Meanwhile, referring again to FIG. 1, shape analysis data including information on shapes of the edge WE and the edge vicinity WF is obtained using the series of coordinates of the surface contour of the wafer W found by performing Operation S30 (S40). Here, the shape analysis data may be quantified and represented.

FIG. 10 is a flowchart for describing an embodiment 40A of Operation S40 illustrated in FIG. 1.

Referring to FIG. 10, a curve made of the series of coordinates of the surface contour of the wafer W found in Operation S30 is smoothed (S42). Since the series of coordinates of the wafer surface contour found in Operation S30 is discrete, mathematically obtaining of the shape analysis data using the curve made of the series of discrete coordinates of the wafer surface contour may be difficult. Therefore, when the curve made of the series of discrete coordinates of the wafer surface contour is smoothed in order to easily and mathematically obtain and analyze the shape analysis data, the smoothed curve may be softer than the curve made of the series of discrete coordinates. Also, in this case, even when mathematical operations such as differentiations, as described below, are performed several times, the shape analysis data may be continuously and stably quantified without causing a large error.

For example, various known smoothing techniques such as an adjacent-averaging method, a Savitzky-Golay filter method, and the like may be used in order to perform Operation S42.

FIGS. 11a to 11c are graphs for describing processes of smoothing of portions 72, 74, and 76 illustrated in FIG. 9(c), respectively, where horizontal axes represent horizontal positions (x) of the wafer W and vertical axes represent vertical positions (y) of the wafer W. That is, FIG. 11a partially represents numeral 72 illustrated in FIG. 9(c), FIG. 11b partially represents numeral 74 illustrated in FIG. 9(c), and FIG. 11c partially represents numeral 76 illustrated in FIG. 9(c).

Referring to FIGS. 11a to 11c, smoothed curves 92, 94, and 96 are respectively obtained by smoothing curves 82, 84, and 86 made of the series of coordinates of the surface contour of the wafer W found in Operation S30 (S42).

After Operation S42 is performed, shape analysis data is calculated using the smoothed curves 92, 94, and 96, and the calculated shape analysis data is provided in various forms (S44). In this case, the shape analysis data may be quantified.

In a mathematical coordinate system, for example, an X-Y coordinate system, the smoothed curves 92, 94, and 96 may be given as a function of a form y=f(x). Therefore, when using this function, the shape analysis data including the information on shapes of the edge WE of the wafer W and the edge vicinity WF, that is, various factors that define the shape of the edge of the wafer, may be mathematically quantified and may be obtained.

According to an embodiment, the shape analysis data may include a curvature formed by both of the edge WE and the edge vicinity WF. That is, the smoothed curves 92, 94, and 96 may be converted into quantified data (or, numerical data) such as a curvature.

In this way, the curves 92, 94, and 96 corresponding to the contour 60 in the sectional image smoothed after converted into the mathematical coordinate system, for example the X-Y coordinate system, may be provided as the function y=f(x), when the shape analysis data to be analyzed is a curvature. Therefore, a curvature C(x) at arbitrary point (x, y) of this function may be obtained by the following Equation 1.

$$C(x) = \frac{-d^2y/dx^2}{(1+[dy/dx]^2)^{1.5}}$$ [Equation 1]

Here, x and y represent a horizontal position and a vertical position of a wafer W, respectively.

According to Equation 1, in order to obtain the curvature C(x), first and second differentiations should be performed. In this case, since the series of coordinates of the surface contour of the wafer W is found based on pixels, the series of coordinates of the surface contour of the wafer W has a discrete characteristic as described above. Therefore, when the curve made of the series of discrete coordinates is not smoothed and first and the second differentiations are performed on the curve, a large error may occur. Therefore, when the curves 82, 84, and 86 made of the series of coordinates of the wafer surface contour are smoothed as in Operation S42, such an error may be prevented from occurring while maintaining the information on the shape of the wafer edge.

FIG. 12 is a graph illustrating results ⓐ, ⓑ, and ⓒ that the first differentiation is performed on results that the curves made of the series of discrete coordinates in the sectional images illustrated in FIGS. 9(a) to 9(c), are smoothed, respectively, where a horizontal axis represents a horizontal position x of the wafer W, and a vertical axis represents a first differentiation value.

FIG. 13 is a graph illustrating curvatures ⓐ, ⓑ, and ⓒ obtained by substituting results that the curves made of the series of discrete coordinates in the sectional images illustrated in FIGS. 9(a) to 9(c) are smoothed, respectively, into Equation 1, where a horizontal axis represents a horizontal position x of the wafer W, and a vertical axis represents a curvature C.

For example, as illustrated in FIGS. 11a to 11c, when the first differentiation is performed on the curves obtained by smoothing the curves made of the series of discrete coordinates in the sectional image illustrated in FIGS. 9(a) to 9(c), continuous and stable differentiation results without causing a large error may be obtained as illustrated in FIG. 12.

Further, when the results that the curves made of the series of discrete coordinates in the sectional images illustrated in FIGS. 9(a) to 9(c) are smoothed are substituted into Equation 1, curvatures with respect to the three sectional image samples may be quantified as illustrated in FIG. 13.

Referring to FIG. 13, among the initial sectional images illustrated in FIGS. 3(a) to 3(c), it may be seen that the curvature ⓐ formed by the wafer surface contour 60 at the edge WE and the edge vicinity WF in the sample illustrated in FIG. 3(a) is largest, and the curvature ⓒ formed by the wafer surface contour 60 at the edge WE and the edge vicinity WF in the sample illustrated in FIG. 3(c) is smallest. Therefore, since the wafer surface contour 60 is most smoothly changed from the edge WE to the edge vicinity WF when comparing the sample illustrated in FIG. 3(c) having the smallest curvature with the other two samples, it may be seen that the sample illustrated in FIG. 3(c) has a good edge shape.

According to another embodiment, the shape analysis data may include a 'normalized gap area (NGA).' According to an embodiment described above, the shape analysis data includes the curvatures for relatively comparing different samples. However, when the NGA is used as the shape analysis data, the NGA may be an absolute indicator for analyzing the shape of the edge.

Hereinafter, the NGA will be described as follows.

First, 'a gap area' is defined as the following Equation 2.

$$GA = UPA - PA \quad \text{[Equation 2]}$$

Here, GA represents a gap area, UPA represents an unprocessed area, and PA represents a processed area. In order to define the UPA and the PA, 'an edge vicinity tangent' and 'a bevel tangent' are defined as follows.

The edge vicinity tangent, which is a tangent at a first point P1 of the wafer surface contour 60 positioned in the edge vicinity WF, refers to an extension line of an upper horizontal plane of the wafer W. The bevel tangent refers to a tangent at a second point P2 that is a basis for a taper angle θt of the bevel portion WB in the wafer surface contour 60 positioned in the bevel portion WB. The edge vicinity tangent and the bevel tangent are disposed based on a point having a maximum curvature in the wafer surface contour 60.

The UPA refers to an area having a trapezoidal shape, which is made of a reference point on a mathematical coordinate system, for example, an X-Y coordinate system, the first point P1, the second point P2, and an intersection of the edge vicinity tangent and the bevel tangent. In this way, in order to include an effect of the taper angle θt in the NGA, the UPA is defined as having the trapezoidal shape rather than a rectangular shape. That is, the trapezoidal shape actually surrounds the wafer surface contour 60.

The PA refers to an area made of the reference point on the mathematical coordinate system, for example, the X-Y coordinate system, the first point P1, the second point P2, and the wafer edge contour 60 of the edge vicinity WF and the bevel portion WB. In this case, since an absolute value of the GA may be affected by a size or a degree of twist of the image captured for the measurement, the GA is normalized into the UPA and the NGA may be used as the shape analysis data.

The reference point on the X-Y coordinate system used in defining the above-described UPA and the above-described PA may be, for example, an x value (referred to as 'x1') of the first point P1 and a y value (referred to as 'y1') of the second point P2.

Hereinafter, in order to help understanding the above-described NGA, the above-described NGA will be described as follows with reference to the accompanying drawings. In this case, the NGA will be described by assuming that the wafer surface contour 60 used in defining the edge vicinity tangent and the bevel tangent refers to the wafer surface contour 60 which is smoothed in Operation S42.

FIG. 14 is a view illustrating an example of a smoothed curve for describing an NGA, where a horizontal axis represents a horizontal position x of the wafer W, and a vertical axis represents a vertical position y of the wafer W.

As described above, for example, when the sectional image illustrated in FIG. 9(c) is smoothed as illustrated in FIGS. 11(a) to 11(c), a curve of the wafer surface contour 60 showing a sectional shape of the edge illustrated in FIG. 14 may be obtained. When the sectional images illustrated in FIGS. 9(a) to 9(c) are smoothed as illustrated in FIGS. 11a to 11c, respectively, curves of the wafer surface contour 60 showing sectional shapes of the edge may be obtained as illustrated in FIG. 14.

Referring to FIG. 14, an edge vicinity tangent CL1, which is a tangent at the first point P1 of the wafer surface contour 60 positioned in the edge vicinity WF, may correspond to an extension line of an upper horizontal plane of the wafer W. Further, a bevel tangent CL2 is positioned on the wafer surface contour 60 positioned in the bevel portion WB, and refers to a tangent at the second point P2 that is a basis for a taper angle θt of the bevel portion WB.

In this case, the UPA refers to an area having a trapezoidal shape made of a reference point (x1, y1), the first point P1, the second point P2, and an intersection P3 of the tangents CL1 and CL2, in FIG. 14. Further, the PA refers to an area made of the reference point (x1, y1), the first point P1, the second point P2, and the wafer surface contour 60. Here, the reference point (x1, y1) may be a point (−100, 20.5) as illustrated in FIG. 14, or may be a lower left corner (0, 0) in the first quadrant of the coordinate system illustrated in FIGS. 9(a) to 9(c).

Therefore, when the PA is subtracted from the UPA as in the above-described Equation 2, a shaded GA in FIG. 14 may be obtained, and the NGA may be obtained by normalizing the GA to be the UPA.

The shape analysis data such as the above-described NGA may be used to analyze the shape of the wafer W, particularly, the edge of the wafer W, through a relationship with the other shape analysis data.

Hereinafter, relationships between the NGA and the other shape analysis data such as a 'maximum curvature of an edge,' a 'curvature radius,' a 'slope angle θs,' and a 'taper angle θt' will be described as follows with reference to the accompanying drawings. Here, referring to FIG. 14, the slope angle θs refers to an angle between the edge vicinity tangent CL1 and the wafer surface contour 60 of the edge vicinity WF. Further, points which are referred to below and illustrated in each of graphs of FIGS. 15 to 18 are values measured at portions that are not contaminated by particles and the like.

FIG. 15 is a graph illustrating a relationship between an NGA and a maximum curvature of an edge, where a horizontal axis represents the maximum curvature of the edge, and a vertical axis represents the NGA.

Referring to FIG. 15, as the maximum curvature of the wafer surface contour 60 is increased, it may be seen that the NGA is decreased. This is because, referring to FIG. 14, as the maximum curvature is increased, the surface contour 60 of the wafer W is moved toward a positive direction of a y-axis as illustrated by arrow 62 of FIG. 14.

FIG. 16 is a graph illustrating a relationship between an NGA and a curvature radius of an edge, where a horizontal axis represents the curvature radius of the edge, and a vertical axis represents the NGA.

Referring to FIG. 16, since the curvature radius has an inverse relationship with respect to the curvature, as the curvature radius is increased, it may be seen that the NGA is increased.

FIG. 17 is a graph illustrating a relationship between an NGA and a slope angle θs, where a horizontal axis represents the slope angle θs, and a vertical axis represents the NGA.

Referring to FIG. 17, as an absolute value of the slope angle θs is increased, it may be seen that the NGA is increased.

FIG. 18 is a graph illustrating a relationship between an NGA and a taper angle θt, where a horizontal axis represents the taper angle θt, and a vertical axis represents the NGA.

Referring to FIG. 18, as an absolute value of the taper angle θt is increased, it may be seen that the NGA is increased.

Referring to FIGS. 15 to 18, it may be seen that the NGA shows consistency in all various types of shape analysis data such as the maximum curvature, the curvature radius, the slope angle θs, and the taper angle θt. In this way, in analyzing the edge shape of the wafer, it may be seen that the NGA is usefully used.

Eventually, according to the embodiment, the sectional shape having high resolution with respect to the edge WE of the wafer W and the edge vicinity WF is acquired, and coordinates of a wafer surface contour in the acquired sectional image may be represented as a curve in a mathematical coordinate system from an image coordinate system. Therefore, as the curve is mathematically processed, the curvature which is one type of the shape analysis data of the edge is quantified as illustrated in FIG. 13 and may be relatively compared, and the NGA which is another type of the shape analysis data of the edge is compared with the other types of the shape analysis data as illustrated in FIGS. 15 to 18, and thus the shape of the edge may be analyzed. In addition, roughness, a gradient, an inclined angle, and the like of the wafer surface may be easily mathematically analyzed using a smoothed curve.

Hereinafter, a wafer shape analyzing apparatus according to the embodiment in which the above-described method of analyzing the shape of the wafer illustrated in FIG. 1, for example, the method of analyzing the edge shape of the wafer, is performed will be described as follows with reference to the accompanying drawings. However, the method of analyzing the shape of the wafer illustrated in FIG. 1 may also be performed in a wafer shape analyzing apparatus having a configuration different from that of the apparatus described as follows. Further, in order to omit the repeated description, operations of each unit of a wafer shape analyzing apparatus to be described below will be described briefly with reference to FIGS. 1, 4, 7, and 10 described above.

FIG. 19 is a block diagram of a wafer shape analyzing apparatus 200 according to an embodiment, which includes an image acquisition unit 210, a contrast adjusting unit 220, a surface contour determining unit 230, and a data analyzing unit 240.

The image acquisition unit 210 acquires a sectional image showing a shape of a wafer W to be analyzed, and outputs the acquired sectional image to the contrast adjusting unit 220. Here, the shape of the wafer shown in the obtained sectional image may include an edge WE and an edge vicinity WF.

That is, since the image acquisition unit 210 performs Operation S10 illustrated in FIG. 1, description identical to that of Operation S10 described above will be omitted.

FIG. 20 is a block diagram of an embodiment 210A of the image acquisition unit 210 illustrated in FIG. 19 which includes an image capturing unit 212 and an image combining unit 214.

The image capturing unit 212 acquires a plurality of divided images by capturing the edge WE of the wafer W and the edge vicinity WF several times, and outputs the obtained divided images to the image combining unit 214. That is, since the image capturing unit 212 performs Operation S12 illustrated in FIG. 4, description identical to that of Operation S12 described above will be omitted.

The image combining unit 214 generates a sectional image by combining the plurality of divided images received from the image capturing unit 212, and outputs the generated sectional image to the contrast adjusting unit 220 through an output terminal OUT3. Since the image combining unit 214 performs Operation S14 illustrated in FIG. 4, description identical to that of Operation S14 described above will be omitted.

Meanwhile, the contrast adjusting unit 220 increases a contrast between the wafer W and a wafer periphery WP in the sectional image received from the image acquisition unit 210, and outputs the sectional image in which the contrast is increased to the surface contour determining unit 230. Since the contrast adjusting unit 220 performs Operation S20 illustrated in FIG. 1, description identical to that of Operation S20 described above will be omitted.

As described above, since Operation S20 may be omitted, the contrast adjusting unit 220 may also be omitted.

The surface contour determining unit 230 finds a series of coordinates of a wafer surface contour in the sectional image which is output from the contrast adjusting unit 220 and in which the contrast is increased, and outputs the series of found coordinates to the data analyzing unit 240. When the contrast adjusting unit 220 is omitted, the surface contour determining unit 230 finds the series of coordinates of the surface contour of the wafer W in the sectional image output from the image acquisition unit 210, and outputs the found result to the data analyzing unit 240. The surface contour determining unit 230 serves to perform Operation S30 illustrated in FIG. 1.

Hereinafter, although the wafer shape analyzing apparatus 200 illustrated in FIG. 19 is described to include the contrast adjusting unit 220 for convenience of description, the embodiment is not limited thereto.

FIG. 21 is a block diagram of an embodiment 230A of the surface contour determining unit 230 illustrated in FIG. 19 which includes a luminance determining unit 232, a luminance difference calculating unit 234, a temporary contour pixel determining unit 235, a contour modification checking unit 236, a coordinate series determining unit 237, and a coordinate conversion unit 238.

The luminance determining unit 232 determines a luminance of each pixel in the sectional image received from the contrast adjusting unit 220 through an input terminal IN2, and outputs the determined luminance to the luminance difference calculating unit 234. Since the luminance determining unit 232 performs Operation S31 illustrated in FIG. 7, description identical to that of Operation S31 described above will be omitted.

The luminance difference calculating unit 234 receives the luminance output from the luminance determining unit 232, calculates luminance differences between adjacent pixels, and outputs the calculated luminance difference to the temporary contour pixel determining unit 235. Since the luminance difference calculating unit 234 performs Operation S32 illustrated in FIG. 7, description identical to that of Operation S32 described above will be omitted.

The temporary contour pixel determining unit 235 determines temporary contour pixels using the luminance differences received from the luminance difference calculating unit 234, and outputs the determined temporary contour pixels to the contour modification checking unit 236.

According to an embodiment, the temporary contour pixel determining unit 235 may find adjacent pixels showing a relatively large luminance difference among the luminance differences calculated in the luminance difference calculating unit 234, determine the found adjacent pixels as the temporary contour pixels, and output the determined temporary contour pixels to the contour modification checking unit 236.

According to another embodiment, the temporary contour pixel determining unit 235 may list the luminance differences calculated in the luminance difference calculating unit 234 in order from largest to smallest, determine pixels showing top level luminance differences in all the listed luminance differences as the temporary contour pixels, and output the determined temporary contour pixels to the contour modification checking unit 236.

Since the temporary contour pixel determining unit 235 performs Operation S33 illustrated in FIG. 7, description identical to that of Operation S33 described above will be omitted.

Further, the temporary contour pixel determining unit 235 may provide a temporary surface contour made of the determined temporary contour pixels to the operator through an output terminal OUT2.

Further, the temporary contour pixel determining unit 235 modifies (or re-determines) the temporary contour pixels, or outputs an array of the temporary contour pixels which are initially determined or re-determined to the coordinate series determining unit 237 in response to a modification request signal output from the contour modification checking unit 236.

The coordinate series determining unit 237 determines the array of the temporary contour pixels received from the temporary contour pixel determining unit 235 as a series of coordinates of a surface contour of the wafer, and outputs the series of determined coordinates to the coordinate conversion unit 238. That is, since the coordinate series determining unit 237 performs Operation S35 illustrated in FIG. 7, description identical to that of Operation S35 described above will be omitted.

The contour modification checking unit 236 checks whether modification of the temporary surface contour formed by the temporary contour pixels is required, generates a modification request signal according to the checked result, and outputs the modification request signal to the temporary contour pixel determining unit 235.

According to an embodiment, the operator may examine the temporary surface contour provided from the temporary contour pixel determining unit 235 through the output terminal OUT2 with the naked eye. As a result of examination with the naked eye, when it is determined that the temporary surface contour is incorrect, the operator may require the modification of the temporary surface contour through an input terminal IN1 to the temporary contour pixel determining unit 235 via the contour modification checking unit 236. To this end, the contour modification checking unit 236 determines whether the modification of the temporary surface contour is required by the operator through the input terminal IN1, and generates a modification request signal and outputs the generated modification request signal to the temporary contour pixel determining unit 235 when it is determined that the modification of the temporary surface contour is required.

According to another embodiment, the contour modification checking unit 236 may determine whether an interval between the temporary contour pixels output from the temporary contour pixel determining unit 235 is out of a threshold distance, and generate a modification request signal and output the generated modification request signal to the temporary contour pixel determining unit 235 when it is determined that the modification of the temporary surface contour is required according to the determined result.

Since the contour modification checking unit 236 performs Operation S34 illustrated in FIG. 7, description identical to that of Operation S34 described above will be omitted.

Further, the coordinate conversion unit 238 receives the array of the temporary contour pixels determined as the series of coordinates of the surface contour from the coordinate series determining unit 237, converts the array of the temporary contour pixels into a series of coordinates having a form of Cartesian coordinates, and outputs the series of converted coordinates of the surface contour having the form of Cartesian coordinates to the data analyzing unit 240 through an output terminal OUT4. Since the coordinate conversion unit 238 performs Operation S36 illustrated in FIG. 7, description identical to that of Operation S36 described above will be omitted.

Meanwhile, referring again to FIG. 19, the data analyzing unit 240 calculates shape analysis data including information on the shape of the edge and the edge vicinity using the series of coordinates of the wafer surface contour output from the surface contour determining unit 230, and outputs the calculated shape analysis data through an output terminal OUT1. The data analyzing unit 240 performs Operation S40 illustrated in FIG. 1.

FIG. 22 is a block diagram illustrating an embodiment 240A of the data analyzing unit 240 illustrated in FIG. 19 which includes a smoothing unit 242, a data calculating unit 244, and a data output unit 246.

The smoothing unit 242 smooths a curve made of a series of discrete coordinates of the surface contour, and outputs the smoothed result to the data calculating unit 244. Since the smoothing unit 242 performs Operation S42 illustrated in FIG. 10, description identical to that of Operation S42 described above will be omitted.

The data calculating unit 244 quantifies and calculates the shape analysis data using the smoothed curve output from the smoothing unit 242, and outputs the calculated result to the data output unit 246. The data output unit 246 outputs the calculated result received from the data calculating unit 244 as various types of the shape analysis data through the output terminal OUT1. The data output unit 246 may output the shape analysis data in a numerical form such as a curvature or angles θs and θt, or may output the shape analysis data in a visual form such as a graph of differentiation values, curvatures, or the like with respect to the shape of the wafer.

Since the data calculating unit 244 and the data output unit 246 perform Operation S44 illustrated in FIG. 10, description identical to that of Operation S44 described above will be omitted.

INDUSTRIAL APPLICABILITY

The embodiments may be used to manufacture and analyze a wafer.

The invention claimed is:

1. A method of analyzing a shape of a wafer, the method comprising:
    acquiring a sectional image showing a wafer to be analyzed by using an electron microscope;
    finding a series of coordinates of a surface contour of the wafer in the sectional image; and
    obtaining shape analysis data including information on a shape of the wafer using the series of coordinates, wherein the finding of the series of coordinates of the surface contour includes:
        obtaining a luminance of each pixel in the sectional image,
        obtaining luminance differences between adjacent pixels,
        determining temporary contour pixels using the luminance differences,
        re-determining the temporary contour pixels when modification of a temporary surface contour formed by the temporary contour pixels is required, and
        determining an array of the temporary contour pixels as the series of coordinates of the surface contour when the modification of the temporary surface contour is not required.

2. The method of claim 1, wherein the sectional image shows an edge of the wafer and an edge vicinity, and the shape of the wafer includes shapes of the edge and the edge vicinity.

3. The method of claim 2, wherein the acquiring of the sectional image includes:
    acquiring a plurality of divided images by capturing the edge and the edge vicinity several times; and
    acquiring the sectional image by combining the plurality of divided images.

4. The method of claim 2, wherein the obtaining of the shape analysis data includes:
    smoothing a curve made of a series of discrete coordinates of the surface contour; and
    calculating the shape analysis data using the smoothed curve.

5. The method of claim 4, wherein the shape analysis data includes a curvature formed by both of the edge and the edge vicinity.

6. The method of claim 4, wherein the shape analysis data includes a normalized gap area obtained by normalizing a gap area derived from an unprocessed area and a processed area.

7. The method of claim 1, further comprising increasing a contrast between the wafer and a periphery of the wafer in the sectional image, wherein the series of coordinates of the surface contour is found in the sectional image in which the contrast is increased.

8. The method of claim 1, wherein the determining of the temporary contour pixels includes finding the adjacent pixels showing a relatively large luminance difference among the luminance differences and determining the found adjacent pixels as the temporary contour pixels.

9. The method of claim 8, wherein the luminance difference is determined as a relatively large luminance difference when the luminance difference is out of a threshold luminance range.

10. The method of claim 9, wherein the threshold luminance range is in a range of a gray scale of 0.01 to a gray scale of 0.1.

11. The method of claim 1, wherein the finding of the series of coordinates of the surface contour further includes converting the array of the temporary contour pixels determined as the series of coordinates of the surface contour into a series of coordinates having a form of Cartesian coordinates.

12. A wafer shape analyzing apparatus, the apparatus comprising:
    an image acquisition unit including an electron microscope configured to acquire a sectional image showing a wafer to be analyzed;
    a surface contour determining unit configured to find a series of coordinates of a surface contour of the wafer in the sectional image output from the image acquisition unit; and
    a data analyzing unit configured to calculate shape analysis data including information on a shape of the wafer using the series of coordinates output from the surface contour determining unit, wherein the surface contour determining unit includes:
        a luminance determining unit configured to determine a luminance of each pixel in the sectional image,
        a luminance difference calculating unit configured to receive the luminance output from the luminance determining unit and calculate luminance differences between adjacent pixels,
        a temporary contour pixel determining unit configured to determine temporary contour pixels using the calculated luminance differences, and re-determine the temporary contour pixels or output the temporary contour pixels in response to a modification request signal,
        a contour modification checking unit configured to check whether modification of the temporary surface contour formed by the temporary contour pixels is required and generate the modification request signal, and
        a coordinate series determining unit configured to determine an array of the temporary contour pixels received from the temporary contour pixel determining unit as the series of coordinates of the surface contour of the wafer and output the series of determined coordinates.

13. The apparatus of claim 12, wherein the sectional image shows an edge of the wafer and an edge vicinity, and the shape of the wafer includes shapes of the edge and the edge vicinity.

14. The apparatus of claim 13, wherein the image acquisition unit includes:
- an image capturing unit configured to capture the edge and the edge vicinity of the wafer several times; and
- an image combining unit configured to combine a plurality of divided images which are captured in the image capturing unit several times and generate the sectional image.

15. The apparatus of claim 12, further comprising a contrast adjusting unit configured to increase a contrast between the wafer and a periphery of the wafer in the sectional image and output the sectional image having the increased contrast to the surface contour determining unit,
- wherein the surface contour determining unit finds the series of coordinates in the sectional image having the increased contrast output from the contrast adjusting unit.

16. The apparatus of claim 12, wherein the temporary contour pixel determining unit finds adjacent pixels showing a relatively large luminance difference among the calculated luminance differences and determines the found adjacent pixels as the temporary contour pixels.

17. The apparatus of claim 12, wherein the surface contour determining unit further includes a coordinate conversion unit configured to convert the array of the temporary contour pixels determined as the series of coordinates of the surface contour into a series of coordinates having a form of Cartesian coordinates and output the series of converted coordinates.

18. The apparatus of claim 12, wherein the data analyzing unit includes:
- a smoothing unit configured to smooth a curve made of a series of discrete coordinates of the surface contour;
- a data calculating unit configured to calculate the shape analysis data using the smoothed curve; and
- a data output unit configured to output a result calculated in the data calculating unit as the shape analysis data.

* * * * *